US007039069B2

(12) United States Patent
Hayashi (10) Patent No.: US 7,039,069 B2
(45) Date of Patent: May 2, 2006

(54) INTERLEAVING METHOD (75) Inventor: Hideyuki Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 933 days.

(21) Appl. No.: 10/075,599

(22) Filed: Feb. 15, 2002

(65) Prior Publication Data

US 2002/0114312 A1 Aug. 22, 2002

(30) Foreign Application Priority Data

Feb. 16, 2001 (JP) ............................. 2001-040181

(51) Int. Cl.
*H04J 3/24* (2006.01)

(52) U.S. Cl. ...................................... 370/474; 370/389

(58) Field of Classification Search ................ 370/389, 370/350, 349, 470, 471, 473, 474, 476, 503, 370/506, 509, 512
See application file for complete search history.

(56) References Cited

U.S. PATENT DOCUMENTS

| 5,889,791 A | * | 3/1999 | Yang ........................... 714/752 |
| 6,151,690 A | * | 11/2000 | Peeters ........................ 714/701 |
| 6,192,493 B1 | * | 2/2001 | Combelles et al. ......... 714/701 |
| 6,564,343 B1 | * | 5/2003 | Yamashita ................... 714/701 |

FOREIGN PATENT DOCUMENTS

| WO | WO 99/51051 | 10/1999 |
| WO | WO 00/78081 A1 | 12/2000 |

OTHER PUBLICATIONS

European Search Report dated Aug. 10, 2004.
Nikolai Nefedov, "Potential Physical Layer Enhancements for AMR Speech over EDGE", 52th Vehicular Technology Conference, 2000 IEEE, vol. 6, Sep. 28, 2000, pp. 2611-2616, XP010525063.
Stefan Eriksson, et al., "Comparison of Link Quality Control Strategies for Packet Data Services in EDGE", Vehicular Technology Conference, 1999 IEEE May 16, 1999, pp. 938-942, XP010342128.
Krishna Balachandran, et al., "MAC Layer Design for Statistical Multiplexing of Voice and Data over EGPRS", 2000 IEEE Wireless Communications and Networking Conference, vol. 2, Sep. 23, 2000, pp. 913-923, XP010532374.

* cited by examiner

*Primary Examiner*—Brenda Pham
(74) *Attorney, Agent, or Firm*—McGinn IP Law Group, PLLC (57) ABSTRACT

There is provided an interleaving method capable of reducing burst errors. Transmitted data includes a plurality of radio blocks. It is assumed that each radio block includes four burst signals and each burst signal includes data signals of 448 bits, flag signals, and a synchronizing signal. On the basis of the occurrence frequency of burst errors, the communication buffer capacity, the transmission delay time allowed between the transmission and reception, the kind of communication data, and radio wave propagation characteristics, the transmission side selects as the burst length of interleaving, a value from among values 4, 8, 16, 28 and 32 that are multiples of the number 4 of burst signals included in each of the radio blocks and that are divisors of the total number 448 of bits of data signals included in each of radio blocks. The transmission side transmits the selected burst length to the reception side, and conducts interleaving on the basis of the selected burst length. The reception side conducts deinterleaving on the basis of the burst length transmitted from the transmission side.

13 Claims, 6 Drawing Sheets

FIG. 5

INTERLEAVING METHOD

FIELD OF THE INVENTION

The present invention relates to an interleaving method applied to packet communication for mobile communication apparatus, such as portable telephone. In particular, the present invention relates to an interleaving method applied to GPRS (General Packet Radio Service), which is the packet communication for portable telephones using the GSM (Global System for Mobile Communications) system.

BACKGROUND OF THE INVENTION

Conventionally, the portable telephone has been used mainly for the speech communication function. Therefore, the communication network of portable telephone is formed on the basis of a circuit switching network. Even during data communication, the portable telephone network must use the circuit switching.

As the Internet spreads, the communication network of portable telephone is currently evolving so as to incorporate the data communication function and multimedia function. Recently, data communication of portable telephone is switching over to communication networks of packet communication utilizing packet switching, which is called i mode in Japan and General Packet Radio Service (hereafter abbreviated to GPRS) abroad.

Figure 1:
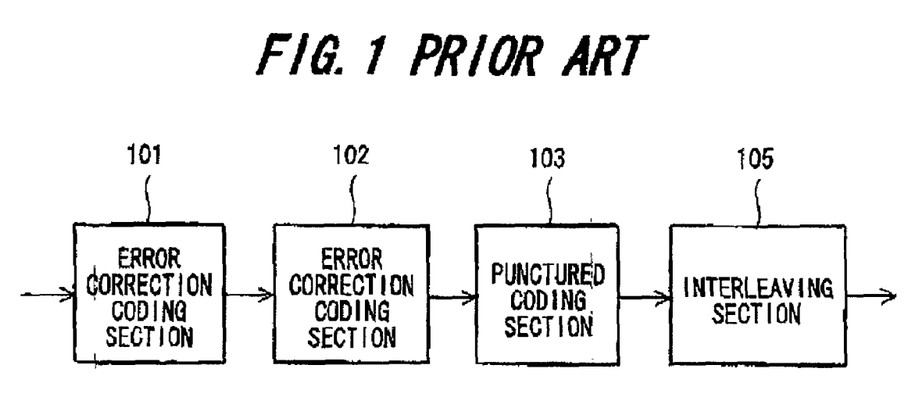
FIG. 1 is a block diagram showing a configuration of a transmission side processing section, which conducts conventional channel coding processing.

In data communication using portable telephone, interleaving is carried out in channel coding processing for the purpose of reducing burst errors. FIG. 1 is a block diagram showing a configuration of a processing section of the transmission side, which conducts channel coding processing. The processing section includes an error correction coding section 101, an error correction coding section 102, a punctured coding processing section 103, and an interleaving section 105. The error correction coding section 101 conducts block coding on packet data blocks, and out puts a result thereof. The error correction coding section 102 conducts convolutional coding on data output from the error correction coding section 101, and outputs resultant data. The punctured coding processing section 103 conducts punctured coding (thinning) on data output from the error correction coding section 102, and outputs resultant data. The interleaving section 105 conducts interleaving on data output from the punctured coding processing section 103, and outputs resultant data.

Once a communication channel is established in data communication utilizing circuit switching, the circuit is maintained in the connected state until the communication channel is disconnected. In data communication utilizing circuit switching, therefore, continuity of burst signals is basically assured. In this case, the burst length of interleaving is determined by considering first an effect of reduction of burst errors, secondly divisors of the total number of bits of data signals to be interleaved, thirdly a communication buffer capacity required for interleaving, fourthly a transmission delay time permitted between transmission and reception, fifthly a kind of communication data such as voice data and video data, and sixthly radio wave propagation characteristics such as fading. For example, in full rates 4.8 kb/s (kilobits per second), 9.6 kb/s, and 14.4 kb/s in data communication of potable telephone of GSM scheme, the burst length of interleaving is 19.

On the other hand, in packet communication utilizing a packet switch, communication channels are shared with other communication in time division, and consequently the continuity of burst signals is not necessarily assured. In such packet communication, each radio block having a predetermined number of (4 in the GPRS) burst signals is handled as a basic unit. Interleaving is carried out by using a predetermined number of burst signals.

Figure 2:
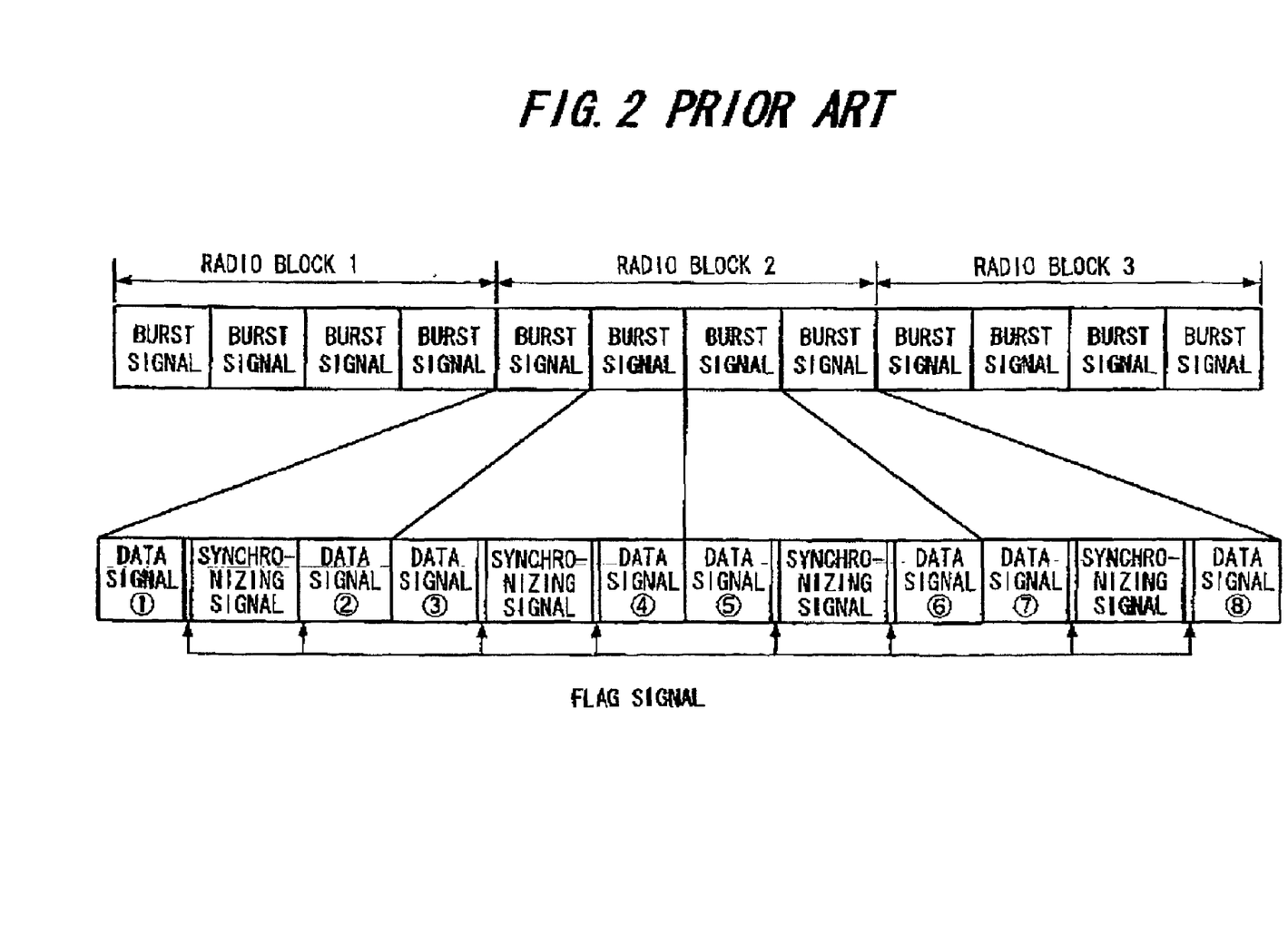
FIG. 2 is a diagram showing a data configuration of radio blocks in GSM portable telephone.

FIG. 2 is a block diagram showing a data configuration of a radio block in GSM portable telephone. As shown in FIG. 2, the data includes some radio blocks. Radio blocks 1 to 3 are shown in FIG. 2. Each of the radio blocks 1 to 3 includes four consecutive burst signals. Each burst signal includes two data signals, two flag signals, and an synchronizing signal.

The subject of interleaving in the radio blocks shown in FIG. 2 is only the data signals. The flag signals and the synchronizing signals do not become the subject of interleaving. If it is assumed that the burst length of data signal interleaving is 4, data signals (1) to (8) are thrown into one and then interleaved.

In the GSM potable telephone, the data signals interleaved as described above are further rearranged in respective burst signals in accordance with a predetermined rule. Thus, two-dimensional interleaving is conducted.

Figure 3:
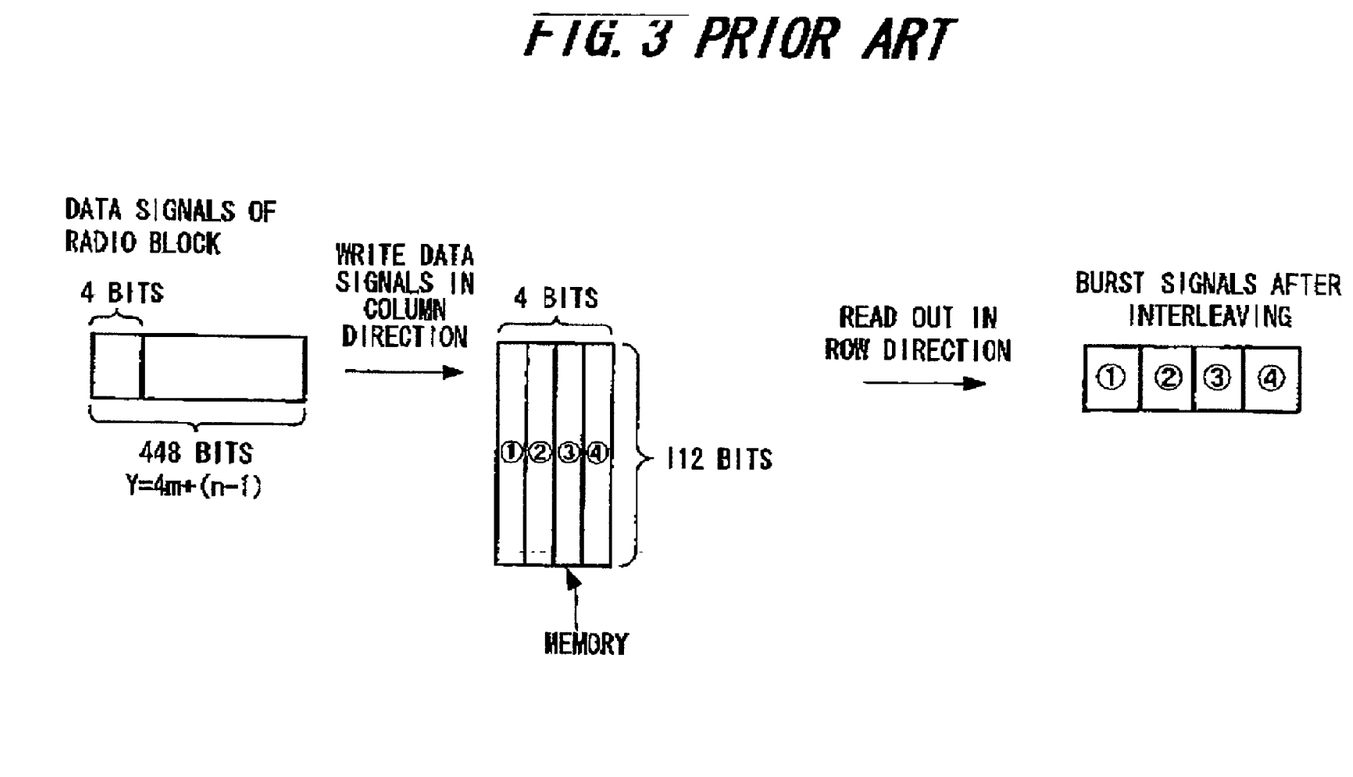
FIG. 3 is a diagram showing a method of interleaving in the case where the burst length is 4.

FIG. 3 is a diagram showing a method of interleaving in the case where the burst length of interleaving is 4 as described above. It is now assumed that the total number of bits of data signals included in each radio block is 448 and the number of bits of data signals included in each burst signal of the radio block 2 is 112. Denoting a data sequence of data signals included in each radio block by Y (0 to 447), the data signals are written into a matrix-formed memory in its column direction in order, beginning with 0. If data of the radio block are written into the memory, the data in the memory are read out in its row direction. In this way, interleaving is carried out. Therefore, a data sequence assigned to nth burst signal after the interleaving can be represented as Y=4m+(n−1) (where m=0 to 111, and n=1 to 4). In packet communication, the above-described continuity of burst signals is not assured. Therefore, it is necessary that the burst length (4) of interleaving in packet communication coincides with the number (4) of burst signals in each radio block.

On the other hand, in the channel coding processing of GPRS, there are four kinds: type 1 to type 4. In the type 1, a burst error correction code having a bit length of 40 called fire code is adopted. In each of the type 2, type 3 and type 4, an error correction code of a different kind having a bit length of 16 is adopted. Depending upon the type, the type of transmitted and received communication data differs. Therefore, there is a problem that the type 2, type 3 and type 4 are affected by burst errors more easily than the type 1. By lengthening the burst length, occurrence of burst errors is reduced. However, the burst length of interleaving conducted in packet communication used in mobile communication such as portable telephone represented by GPRS is fixed to 4. Therefore, the burst errors cannot be reduced by lengthening the burst length.

As heretofore described, the burst length of interleaving conducted in packet communication used in mobile communication such as portable telephone represented by GPRS is fixed. This results in a problem that the burst errors cannot be reduced by adjusting the burst length.

SUMMARY OF THE INVENTION

An object of the present invention is to provide an interleaving method capable of reducing busrst errors.

In accordance with a first aspect of the present invention, there is provided an interleaving method for interleaving data signals, when conducting packet communication by using radio blocks, each of the radio blocks including a predetermined number of burst signals, each of the burst signals including data signals each having a predetermined number of bits, flag signals, and a synchronizing signal, the interleaving method including the steps of: selecting, on a transmission side, a burst length of interleaving from among values that are multiples of the predetermined number and that are divisors of a total number of bits of data signals included in each of the radio blocks, and transmitting the burst length to a reception side; conducting, on the transmission side, interleaving based on the burst length, and transmitting interleaved data to the reception side; and conducting, on the reception side, deinterleaving on the interleaved data based on the burst length transmitted from the transmission side.

According to the first aspect, a value depending on predetermined situations is selected as the burst length from among values that are multiples of the predetermined number and that are divisors of the total number of bits of data signals included in each of radio blocks. Even in packet communication of mobile communication in which the continuity of burst signals is not assured, therefore, the length of interleaving in the burst signal direction can be varied dynamically and adaptively. As a result, burst errors can be reduced by altering the burst length according to the situation.

A second aspect of the present invention provides the interleaving method according to the first aspect, wherein if a total number of burst signals of radio blocks to be transmitted is a multiple of the predetermined number, and is not a divisor of a total number of bits of data signals included in each of radio blocks, then the transmission side selects some values from among values that are multiples of the predetermined number and that are divisors of the total number of bits of data signals included in each of radio blocks, so as to make a sum of the selected some values equal to the total number of burst signals of radio blocks to be transmitted, and the transmission side conducts interleaving on respective portions of the radio blocks by using the selected some values.

According to the second aspect, some values are selected as the burst length from among values that are multiples of the number of burst signals included in each of radio blocks and that are divisors of the total number of bits of data signals included in each of radio blocks. Interleaving can be conducted by combining the some burst lengths. As a result, interleaving can be carried out on an arbitrary number of radio blocks.

DETAILED DESCRIPTION OF THE PREFERRED EMBODIMENTS

An interleaving method of the present invention will now be described in detail by referring to the drawings.

(First Embodiment)

First, an interleaving method of a first embodiment according to the present invention will be described. In the interleaving method of the present embodiment, the burst length of interleaving is made variable. The burst length is determined from among numbers that are divisors of the total number of bits of data signals included in each radio block and multiples of the number of burst signal included in each radio block. Assuming that the total number of bits of data signals included in each block is 448 and the number of burst signals included in each radio block is 4, the burst length of interleaving becomes 4, 8, 16, 28, 32, 56, 64, 112, 224 or 448.

FIGS. 4A to 4E are diagrams showing an interleaving method of the present embodiment. Each radio block of FIGS. 4A to 4E has four burst signals. Therefore, the burst length of the interleaving method for radio blocks of FIGS. 4A to 4E becomes a multiple of 4.

Figure 4:
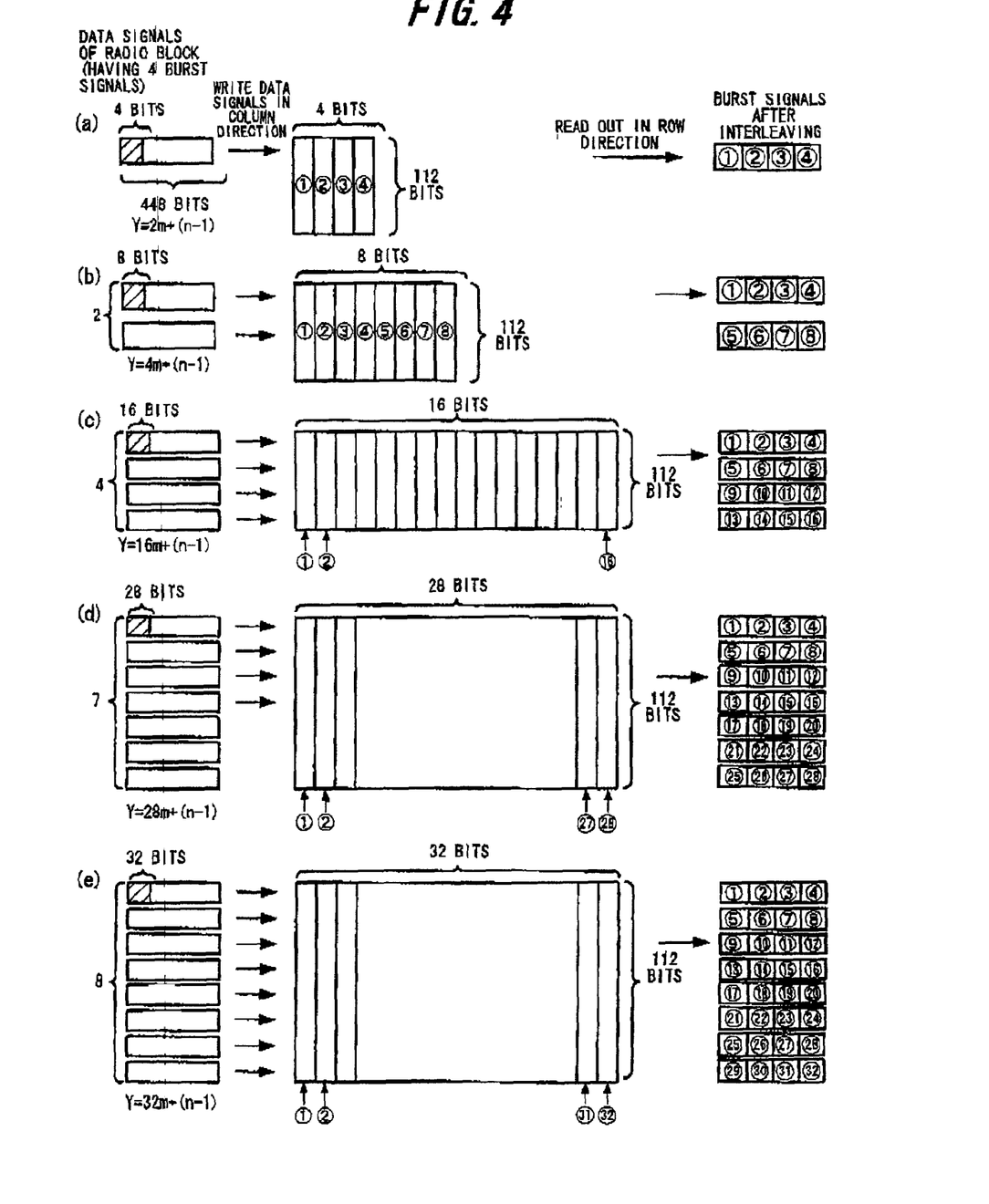
FIGS. 4A to 4E are diagrams showing an interleaving method of a first embodiment according to the present invention.

FIG. 4A shows interleaving processing conducted when the burst length of interleaving is 4. When the burst length of interleaving is 4, the number of burst signals required for interleaving becomes 4 as described above, and the number of radio blocks required for interleaving becomes 1. In other words, one radio block becomes the minimum unit of interleaving. In the interleaving method of the present embodiment, the burst length of interleaving is altered by combining a plurality of radio blocks, each of which is the minimum unit of interleaving.

FIG. 4B shows interleaving processing conducted when the burst length of interleaving is 8. When the burst length of interleaving is 8, the number of burst signals required for interleaving becomes 8 because it is necessary to make the burst length of interleaving coincide with the number of burst signals of radio blocks required for interleaving. Therefore, the number of burst signals required for interleaving becomes 8, and the number of radio blocks required for interleaving becomes 2. Denoting a data sequence of data signals included in each radio block by Y (0 to 447), a data sequence assigned to nth burst signal after the interleaving can be represented as Y=8m+(n−1) (where m=0 to 55, and n=1 to 8).

FIG. 4C shows interleaving processing conducted when the burst length of interleaving is 16. When the burst length of interleaving is 16, the number of burst signals required for interleaving becomes 16, and the number of radio blocks required for interleaving becomes 4. Denoting a data sequence of data signal included in each radio block by Y (0 to 447), a data sequence assigned to nth burst signal after the interleaving can be represented as Y=16m+(n−1) (where m=0 to 27, and n=1 to 16).

FIG. 4D shows interleaving processing conducted when the burst length of interleaving is 28. When the burst length of interleaving is 28, the number of burst signals required for interleaving becomes 28, and the number of radio blocks required for interleaving becomes 7. Denoting a data sequence of data signals included in each radio block by Y (0 to 447), a data sequence assigned to nth burst signal after the interleaving can be represented as Y=28m+(n−1) (where m=0 to 15, and n=1 to 28).

FIG. 4E shows interleaving processing conducted when the burst length of interleaving is 32. When the burst length of interleaving is 32, the number of burst signals required for interleaving becomes 32, and the number of radio blocks required for interleaving becomes 8. Denoting a data sequence of data signals included in each radio block by Y (0 to 447), a data sequence assigned to nth burst signal after the interleaving can be represented as Y=32m+(n−1) (where m=0 to 13, and n=1 to 32).

If at least one data from among data of burst signals before interleaving is assigned to every burst signal after interleaving, the maximum value of burst length of interleaving becomes 112. The burst length of interleaving can be set to 56, 64 or 112 as well. In this case, however, a large communication buffer capacity is needed in the transmission side and the reception side. In the interleaving method of the present embodiment, therefore, a burst length in the range of 4 to 32, which is a practical range, is used. As the number of burst signals required for interleaving increases, however, a larger communication buffer capacity is needed on the transmission side and the reception side. Therefore, the maximum value of burst length of interleaving is limited by the capacity of communication buffers mounted on the transmission side and the reception side. Further, as the number of burst signals required for in interleaving increases, the transmission delay time between the transmission side and the reception side also becomes longer. Therefore, the maximum value of burst length of interleaving is limited by an allowed transmission delay time as well.

In the interleaving method of the present embodiment, the burst length of interleaving can be altered according to the effect of reduction of burst errors in transmission and reception. In general, as the burst length of interleaving becomes longer, the occurrence rate of burst errors decreases. In the interleaving method of the present embodiment, therefore, the transmission side makes the burst length of interleaving longer when burst errors frequently occur, whereas the transmission side makes the burst length of interleaving shorter when few burst errors occur. Further, in the interleaving method of the present embodiment, the burst length of interleaving can also be altered according to the kind of communication data and the radio wave propagation characteristics.

In the interleaving method of the present embodiment, the transmission side alters the burst length of interleaving according to the above-described communication situation, as described above. Therefore, the reception side needs to know the burst length of interleaving conducted on the transmission side, because the reception side needs to deinterleave the interleaved data signals.

In the interleaving method of the present embodiment, two methods are used to notify the reception side of the burst length of interleaving conducted on the transmission side. In a first method, the transmission side transmits control information, inclusive of information that indicates the burst length of interleaving conducted on the transmission side, to the reception side prior to transmission of data. In a second method, the transmission side incorporates the burst length of interleaving in a flag signal of a radio block of the above described data, and transmits the burst length of interleaving together with the data. By using these methods, the reception side can conduct deinterleaving on the bass of the burst length of interleaving actually used by the transmission side.

Figure 5:
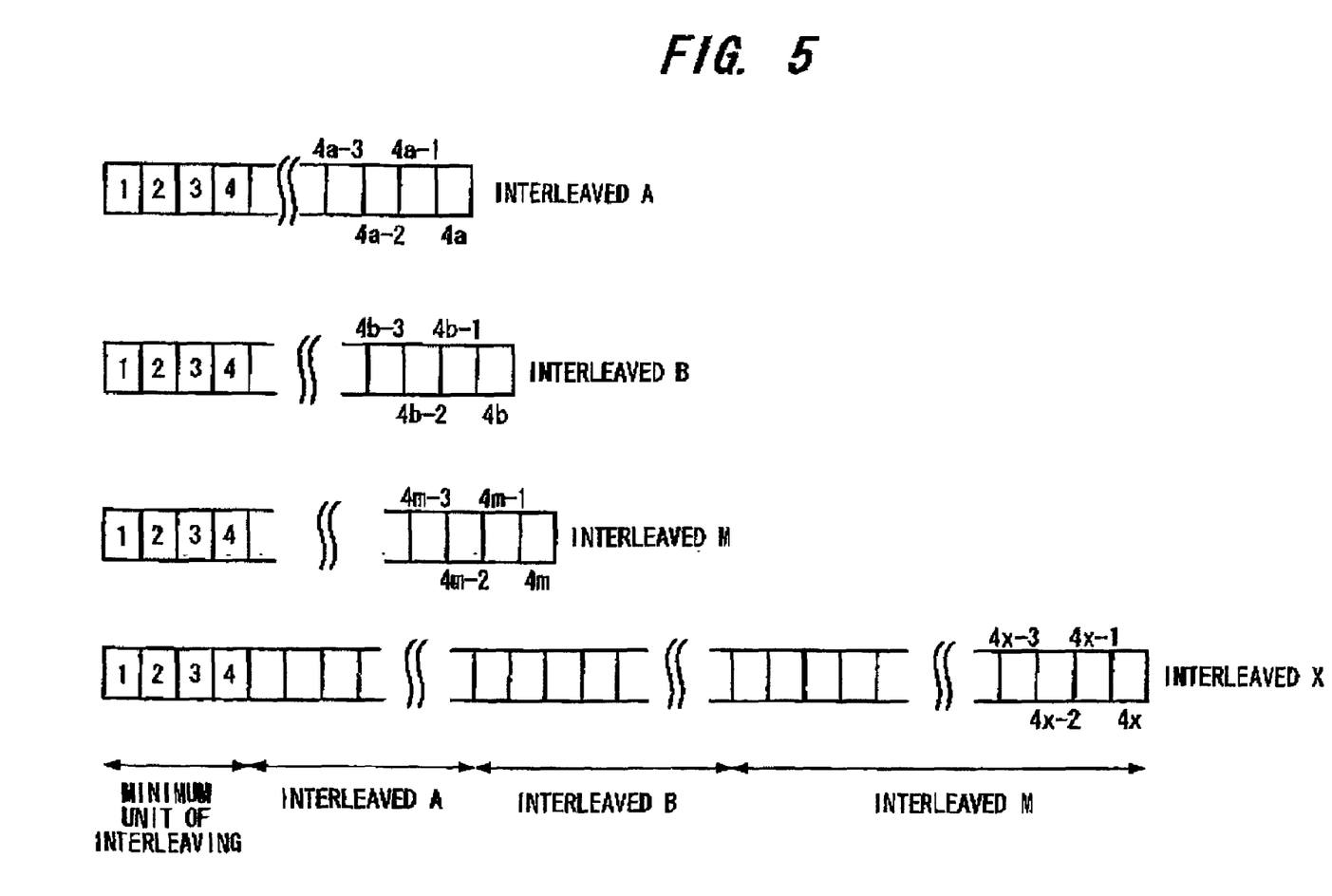
FIG. 5 is a diagram showing an example of data interleaved by using an interleaving method of a first embodiment according to the present invention.

FIG. 5 is a diagram showing an example of data interleaved by using the interleaving method of the present embodiment. Denoting a specific multiple of 4 by 4a (where "a" is a natural number of at least 2), data interleaved with a burst length of 4a is referred to as interleaved A. Denoting a specific multiple of 4 different from 4a by 4b, data interleaved with a burst length of 4b is referred to as interleaved B. Denoting a specific multiple of 4 different from 4a and 4b and that is a maximum value by 4m, data interleaved with a burst length of 4m is referred to as interleaved M. Denoting an arbitrary multiple of 4 by 4x, x can be represented as a sum of numbers selected from among 1, a, b and m. If the relation x=1+a+b+m is satisfied, interleaved X can be represented as shown in FIG. 5. It is now assumed in the interleaving method of the present embodiment that the total number x of burst signals of radio blocks to be transmitted is a multiple of the number of burst signals included in each radio block and the total number x of burst signals of radio blocks to be transmitted is not included in values 1, . . . a, . . . b, . . . m that are divisors of the total number of bits of data signals included in each radio block. In this case, the transmission side selects some values (1, a, b and m) so that a sum of some values (in FIG. 5, 1+a+b+m) included in 1, . . . a, . . . b, . . . m will become equal to the total number x of burst signals, and conducts interleaving on respective portions of radio blocks to be transmitted to the reception side, by using all of the some values (1, a, b and m) as the burst length. In the interleaving method of the present embodiment, it is possible to carry out interleaving on an arbitrary number of radio blocks by using a combination of some burst lengths.

In the interleaving method of the present embodiment, it is also possible to conduct interleaving and then rearrange data by further conducting interleaving to perform two-dimensional interleaving, in order to further enforce the conversion of burst errors to random errors.

(Second Embodiment)

Next, an interleaving method of a second embodiment according to the present invention will now be described in detail by referring to the drawing. In the interleaving method of the present embodiment, interleaving is conducted on the basis of the interleaving method of the first embodiment. In the interleaving method of the present embodiment, however, it is assumed that the total number of bits of data signals included in each of radio blocks to be interleaved is 448+4n (where n is a natural number).

Figure 6:
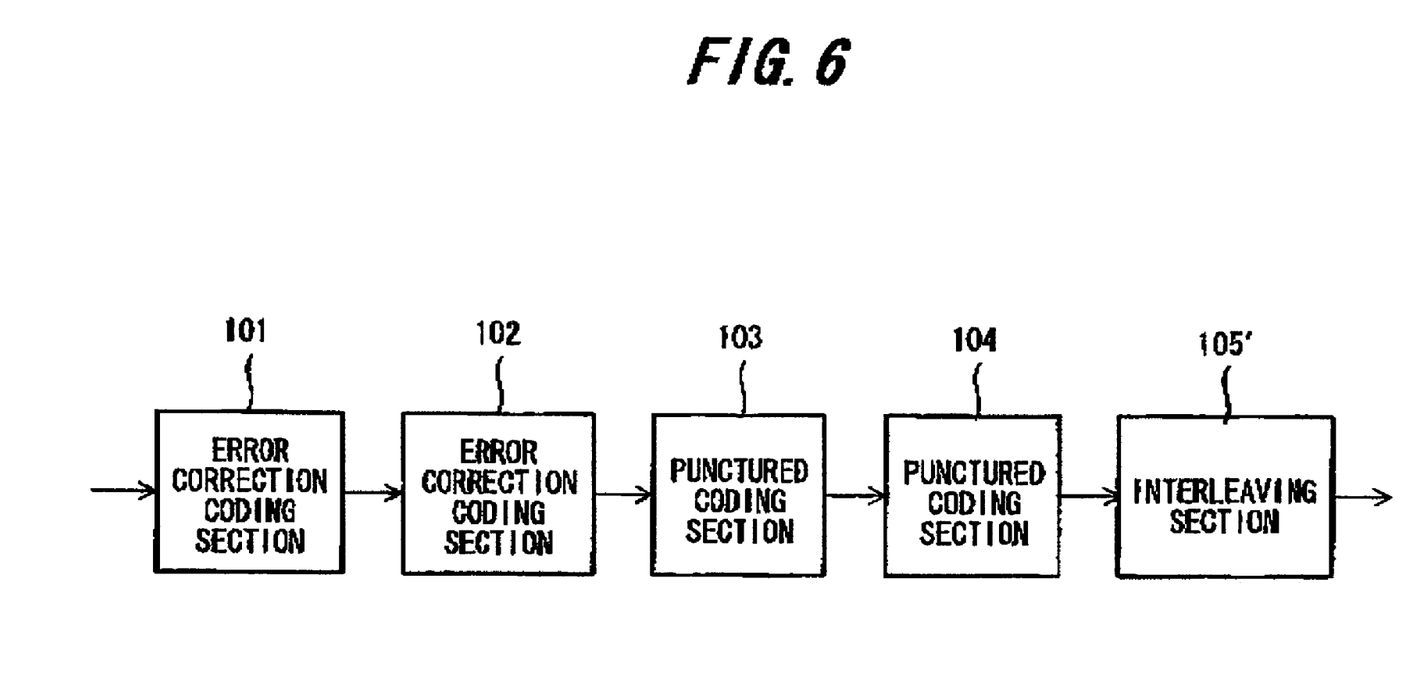
FIG. 6 is a block diagram showing a configuration of a transmission side processing section, which conducts channel coding processing in an interleaving method of a second embodiment according to the present invention.

Radio blocks are formed by conducting channel coding processing on packet data blocks. FIG. 6 is a block diagram showing a configuration of a transmission side processing section, which conducts channel coding. The processing section differs from the configuration of the transmission side processing section of FIG. 1 in that the interleaving processing section 105 is replaced by an interleaving processing section 105' and a punctured coding section 104 is provided between the punctured coding section 103 and the interleaving processing section 105'.

The interleaving processing section 105' conducts interleaving shown in the interleaving method of the first embodiment.

The punctured coding section 104 conducts punctured code processing for periodically erasing data of 4n bits, and thereby adjusts the number of bits of data signals so as to make the number of bits of data signals to be interleaved, among data signals of radio blocks equal to 448. The data signals of 4n bits obtained by the adjustment conducted in the punctured coding section 104 are assigned as flag signals of radio blocks, and information that indicates the burst length of interleaving is incorporated therein. The interleaving processing section 105' conducts interleaving on adjusted data signals of 448 bits.

In GPRS, which is the packet communication scheme of GSM portable telephone, data signals of radio blocks have 456 bits. In type 2 and type 3 of channel coding, punctured coding as described above is used. The punctured coding section 104 conducts punctured code processing for periodically erasing data of 8 bits, and thereby adjusts the number of bits of data signals so as to make the number of bits of data signals to be interleaved, among data signals of radio blocks equal to 448. Data of 8 bits, which is not directly related to interleaving, are assigned as flag signals, and information that indicates the burst length of interleaving is incorporated therein.

As heretofore described, according to the first aspect of the present invention, a value depending on the situations, such as the occurrence frequency of burst errors, the communication buffer capacity, the transmission delay time allowed between the transmission and reception, the kind of communication data, and radio wave propagation characteristics, is selected in packet communication of mobile communication as the burst length from among values that are multiples of the number of burst signals included in each of the radio blocks and that are divisors of the total number of bits of data signals included in each of radio blocks. Even in packet communication of mobile communication in which the continuity of burst signals is not assured, therefore, the length of interleaving in the burst signal direction can be varied dynamically and adaptively according to the situation. As a result, burst errors can be reduced.

According to the second aspect of the present invention, some values are selected as the burst length from among values that are multiples of the number of burst signals included in each of radio blocks and that are divisors of the total number of bits of data signals included in each of radio blocks. Interleaving can be conducted by combining the some burst lengths. As a result, interleaving can be carried out on an arbitrary number of radio blocks.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. An interleaving method for interleaving data signals, when conducting packet communication by using radio blocks, each of the radio blocks including a predetermined number of burst signals, each of the burst signals including data signals each having a predetermined number of bits, flag signals, and a synchronizing signal, the interleaving method comprising the steps of:
   selecting, on a transmission side, a burst length of interleaving from among values that are multiples of the predetermined number and that are divisors of a total number of bits of data signals included in each of the radio blocks, and transmitting the burst length to a reception side;
   conducting, on the transmission side, interleaving based on the burst length, and transmitting interleaved data to the reception side; and
   conducting, on the reception side, deinterleaving on the interleaved data based on the burst length transmitted from the transmission side.

2. The interleaving method according to claim 1, wherein
   if a total number of burst signals of radio blocks to be transmitted is a multiple of the predetermined number, and is not a divisor of a total number of bits of data signals included in each of radio blocks,
   then the transmission side selects some values from among values hat are multiples of the predetermined number and that are divisors of the total number of bits of data signals included in each of radio blocks, so as to make a sum of the selected some values equal to the total number of burst signals of radio blocks to be transmitted, and
   the transmission side conducts interleaving on respective portions of the radio blocks by using the selected some values.

3. The interleaving method according to claim 1, wherein a maximum value of the burst length is limited so as to make it possible to assign to every burst signal after interleaving, at least one bit among bits of burst signals before interleaving.

4. The interleaving method according to claim 1, wherein a maximum value of the burst length is limited so as to prevent a total number of bits of data signals required for interleaving from exceeding a communication buffer capacity.

5. The interleaving method according to claim 1, wherein a maximum value of the burst length is limited so as to prevent a transmission delay time between the transmission side and the reception side from exceeding an allowed time.

6. The interleaving method according to claim 1, wherein
   the transmission side incorporates the burst length into control information to be transmitted to the reception side prior to transmission of interleaved data, and transmits the control information, and
   the reception side deinterleaves the interleaved data based on the burst length incorporated in the control information.

7. The interleaving method according to claim 1, wherein the transmission side determines the burst length from among values that are multiples of the predetermined number and that are divisors of the total number of bits of data signals included in each of radio blocks, based on an effect of reduction of burst errors.

8. The interleaving method according to claim 1, wherein the transmission side determines the burst length from among values that are multiples of the predetermined number and that are divisors of the total number of bits of data signals included in each of radio blocks, based on a kind of transmitted and received data.

9. The interleaving method according to claim 1, wherein the transmission side determines the burst length from among values that are multiples of the predetermined number and that are divisors of the total number of bits of data signals included in each of radio blocks, based on radio wave propagation characteristics in transmission and reception.

10. The interleaving method according to claim 1, wherein the predetermined number is four.

11. The interleaving method according to claim 1, wherein the total number of bits of data signals included in each of the radio blocks is 448.

12. The interleaving method according to claim 1, wherein if the total number of bits of data signals included in each of the radio blocks is 448+4n (where n is a natural number), then the transmission side adjusts the total number of bits of data signals included in each of the radio blocks by using punctured coding so as to make the total number of bits of data signals included in each of the radio blocks equal to 448 before conducing interleaving, and the transmission side conducts interleaving with the adjusted data signals.

13. The interleaving method according to claim 12, wherein the transmission side assigns the data signal of 4n bits that have not been interleaved by the adjustment to the flag signal, and the transmission side incorporates the burst length into the data signal of 4n bits and transmits the interleaved data to the reception on side.

* * * * *